US006859814B2

(12) United States Patent
Kiriaki

(10) Patent No.: US 6,859,814 B2
(45) Date of Patent: *Feb. 22, 2005

(54) TRANSPOSE FIR FILTER ARCHITECTURE

(75) Inventor: Sami Kiriaki, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 630 days.

This patent is subject to a terminal disclaimer.

(21) Appl. No.: 09/851,059

(22) Filed: May 8, 2001

(65) Prior Publication Data

US 2001/0056450 A1 Dec. 27, 2001

Related U.S. Application Data

(60) Provisional application No. 60/214,309, filed on Jun. 27, 2000.

(51) Int. Cl.[7] .............................................. G06F 17/10
(52) U.S. Cl. ....................................... 708/316; 708/319
(58) Field of Search ................................ 708/300, 301, 708/313, 316, 319, 320

(56) References Cited

U.S. PATENT DOCUMENTS

| 5,339,264 A | * | 8/1994 | Said et al. | 708/319 |
| 5,392,230 A | * | 2/1995 | Christopher | 708/316 |
| 5,648,923 A | * | 7/1997 | Lane et al. | 708/319 |
| 6,625,628 B1 | * | 9/2003 | Matsuura | 708/300 |

OTHER PUBLICATIONS

Transposed FIR Filter Structure with Time–Varying Coefficients for Digital Data Sampling, Jennifer Webb; IEEE Trans. Signal Processing, pp. 1–11, 1999.

Introduction to Digital Signal Processing; Design of Digital Filters; pp. 654–671, 1988.

Sampling–Rate Conversion of Video Signals; Ajay Luthra and ganesh Rajan; SMPTE Journal, Nov. 1991; pp. 869–879.

Interpolation and Decimation of Digital Signals—A Tutorial Review; Ronald E. Cochiere and Lawrence R. Rabiner; Proceedings of the IEEE, vol. 69, No. 3, Mar. 1981; pp. 300–326.

* cited by examiner

Primary Examiner—Chuong Dinh Ngo
(74) Attorney, Agent, or Firm—April Mosby; Wade James Brady, III; Frederick J. Telecky, Jr.

(57) ABSTRACT

A novel Finite Impulse Response ("FIR") filter (100) is provided with. A master/slave sample and hold architecture is employed. In this architecture, an input signal ($V_{IN}$) is coupled to an input of a master sample and hold circuit (104). At least two slave sample and hold circuits (114, 118) connect to the master output. The slave sample and hold circuits (114, 118) operate at 1/k times the clock rate of the master sample and hold circuit (104), where k equals the number of slave sample and hold circuits (114, 118). A first multiplexer (126) multiplexes the slave outputs together. At least one tap block (129, 179, 207) is coupled to the first multiplexer (126) includes a multiplier (132, 180, 210), a summer (142, 142, 216), at least two slave sample and hold circuits (152, 154, 188, 190, 224, 226) and a second multiplexer (164, 200, 236). The slave sample and hold circuits (152, 154, 188, 190, 224, 226) run at 1/k times the clock speed of the master sample and hold circuit (126).

12 Claims, 3 Drawing Sheets

TRANSPOSE FIR FILTER ARCHITECTURE

The present application claims priority from U.S. Provisional Patent Application Ser. No. 60/214,309, entitled: TRANSPOSE FIR FILTER ARCHITECTURE, filed on Jun. 27, 2000.

FIELD OF THE INVENTION

The present invention relates to analog and digital filtering, and, more particularly, to a transpose finite impulse response (FIR) filter architecture for an analog and digital.

BACKGROUND OF THE INVENTION

Digital filters are being used in an increasing number of electronic devices. One commonly used type of digital filter is a finite impulse response (FIR) filter. The FIR filter is a sampled data filter characterized by its impulse response. Its input signal is a discrete time sequence which may be analog or digital while its output is also a discrete time sequence which is the convolution of the input sequence and the filter impulse response. The relationship between the input samples $V_i[n]$ and output samples $V_o[n]$ is given by:

$$V_o[n] = A_0 V_i[n] + A_1 V_i[n-1] + A_2 V_i[n-2] + \ldots + A_{N-1} V_i[n-N+1] \quad (1)$$

Applying the Z-transform, the previous relationship can be represented as:

$$V_o(z) = A_0 V_i(z) + A_1 V_i(z) Z^{-1} + A_2 V_i(z) Z^{-2} + \ldots + A_{N-1} V_i(z) Z^{-(N-1)} \quad (2)$$

The components of the coefficient vector $A_0 \ldots A_{N-1}$ are ordinarily referred to as filter tap weights. In the impulse response of the filter, there is no feedback and thus it is an all zero filter, which means that the response is shaped by placement of transmission zeroes in the frequency domain. This class of filters facilitates the implementation of adaptive filter structures.

FIR filters may be implemented in the analog domain or in the digital domain. An analog FIR filter implementation typically performs multiplication of the tap weights and the input signal samples using analog multipliers, and sums each term using an analog summer. In a digital FIR filter implementation, multiplication of the tap weights and the input signal samples as well as summation of each term in equation 1, are typically performed digitally.

Although digital FIR filters normally produce an output signal with a higher signal to noise ratio than an analog FIR filter, digital FIR filters are impractical for some applications. For example, analog FIR filters may normally operate at much higher speeds and lower power consumption than digital FIR filters. Analog FIR filters, therefore, are most commonly used in high speed applications such as, for example, magnetic disk drive read channels, radios, modems, and communication channels. However, existing architectures for FIR filters have various drawbacks when used for analog FIR filters.

One existing analog FIR implementation is an analog delay line based architecture. This architecture typically includes an analog delay line, analog multipliers, and an N-input analog summing block. The filter output is the sum of the inner product of the input vector and the coefficient vector. The analog delay line is normally composed of a chain of analog sample and hold amplifiers. Each sample and hold amplifier samples during the holding time of the preceding sample and hold amplifier in the chain. The problem with the delay line based architecture is that in the process of sampling, the signal acquires a certain amount of noise, offset, and distortion. After the analog signal has passed through a chain of sample and hold amplifiers, the level of distortion is often unacceptable.

An analog FIR filter architecture that avoids multiple sampling of the input signal is one employing round robin sampling of the input signal. In this type of architecture, the signal is sampled in a round robin manner, preventing error accumulation from one sample and hold amplifier to the next. Each sample and hold amplifier's output connects to an analog multiplier. In order to simulate delay, the output of the sample and hold amplifier is multiplied in the analog multiplier by a series of tap weights that are shuffled every clock cycle. For example, in a three tap filter, the output of a given sample and hold amplifier will be multiplied by tap weight $A_0$ during the first clock cycle after sampling, by tap weight $A_1$ during the second clock cycle after sampling, and by tap weight $A_3$ on the third clock cycle after sampling.

The problem with this architecture is that the digital tap weights need to be shuffled every clock cycle. A large number of signals, therefore, need to be switched on every clock cycle. For example, in a 9 tap filter using 6-bit digital-to-analog converters, 54 signals are switched during every clock cycle. This heavy switching consumes a large amount of power, especially if the signals are at full CMOS levels. In addition, switching noise can be significant and can affect filter performance. For certain digital-to-analog converter (DAC) circuit implementations where overlapping clocks are required, both true and complement signals are needed. This will double the number of shuffled signals, increasing both power consumption and digital noise generation. Moreover, the shuffling of coefficients every clock cycle poses a great demand on the settling time of the DACs. Lesser settling time is attained at the expense of larger power consumption as faster DAC's consume more power.

The previous two analog FIR filter structures described above are known as direct form FIR filter implementations. In an alternative filter implementation the input signal is multiplied by all of the tap coefficients, and delayed versions of the taps are combined together at the output to form the final filter output. Integrators integrate the final filter output over N-clock cycles for an N-tap filter. During each clock cycle, a new multiplying DAC is switched and accumulated in a round robin manner on the integrating capacitor of the integrator block. This FIR filter architecture thus eliminates tap coefficient shuffling at the input of each multiplying DAC.

The problem with this architecture, however, is in the circuit implementation of the integrators and multiplying DACs. In order to achieve high speed and low power consumption, a current-based multiplying DAC is normally used. Then, to perform summation, the current produced by the multiplying DACs is switched onto the capacitor which sums up the charge over N clock cycles. Although such circuit implementation may achieve greater speed, filter performance is greatly diminished due to both clock jitter and integration of switching transients.

The first and second architectures described above employ multiple sample and hold circuits. Ideally, each sample and hold circuit would hold its output at a precise time during a clock transition. Precisely defined sampling instants, however, are difficult to achieve in actual sample and hold circuit implementations. Often, when multiple sample and hold circuits are used in a larger circuit, each sample and hold samples at a slightly different time. In other words, the actual sampling time can occur within a certain neighborhood of a clock edge and the precise sampling time will often vary among multiple sample and holds.

Sample and hold circuit timing errors can lead to several problems. First, the signal to noise ratio of the output of the FIR filter may be disturbed. The equations used to derive a FIR filter assume that an input signal is being sampled at precise instants. When sample and hold circuit timing errors cause the sampling time to deviate from those precisely defined instants, the signal is being sampled at the wrong time and, typically, the signal will have changed value since the precisely defined sampling instant. In effect, the FIR filter receives an incorrect signal value because it samples the signal at an improper time.

In addition, sample and hold timing errors may cause clock jitter as the output of a FIR filter is often fed back into a phase locked loop to generate the clock used to control sampling. Clock jitter on the FIR filter clock further degrades filter performance.

One approach for a high speed FIR filter architecture with precise timing acquisition consumes less power than existing architectures and eases circuit implementation of FIR filters as is disclosed in U.S. Pat. No. 6,032,171, which is incorporated by reference herein. In this type of implementation an input signal is coupled to a master input of a "master" sample and hold circuit. A plurality of "slave" sample and hold circuits are coupled to the output of the master sample and hold circuit. The outputs of these circuits may then be used in the taps of a FIR filter by multiplexing the outputs to a plurality of multipliers in a round robin manner.

This FIR filter architecture implementation, however, can lead to several problems. First, round robin digital logic consumes more power. In addition, use of a large number of taps increases parasitic capacitance at the output. Accordingly, the resistive load at the output and the parasitic capacitance form a dominant pole which results in degradation of the filter's speed. One approach of correcting this problem includes cascading the filter with a cascode transistor to decouple the parasitic capacitance from the output node where the signal is actually observed. Since, however, the power supply is limited, typically 5 volts, headroom problems arise. Another disadvanage which exists is that the FIR output gain is limited by total output common-mode voltage.

Accordingly, a need has arisen for a high speed FIR filter architecture that eliminates the need for round robin digital logic and enables the use of a large number of taps without speed degradation. Moreover, there is a need for a high speed FIR filter architecture that is not limited by the total output common-mode voltage.

SUMMARY OF THE INVENTION

To address the above-discussed deficiencies of a FIR filter architecture, the present invention is directed to a finite impulse response filter having an input and an output, including a master sample and hold circuit. The master sample and hold circuit samples a first input signal and holds the value of the first input signal on the master output for a predetermined period of time. At least two slave sample and hold circuits connect to the master output. The slave sample and hold circuits operate at substantially 1/k times the clock rate of the master sample and hold circuit; where k equals the number of slave sample and hold circuits coupled to each multiplexer.

At least one tap block couples to the first multiplexer and includes a multiplier, a summer, slave sample and hold circuits and a second multiplexer. The multiplier multiplies the multiplexed signal by a coefficient signal representing a FIR coefficient. The summer sums the multiplier output and a tap input. At least two slave sample and hold circuits connect to the summer output and run at substantially 1/k times the clock speed of the master sample and hold circuit. The second multiplexer receives the held signals from the slave outputs of the tap block to generate the output for the FIR filter. In an embodiment including one or more tap blocks, the tap input for the first tap block may be grounded and tap input for all other tap blocks is the preceding tap block output.

Accordingly, a more power efficient FIR filter exists which enables the connection of a large number of taps without degrading speed. In addition, the power supply head-room problem due to cascoding the filter with a cascode transistor to decouple the parasitic capacitance from the output node no longer exists. Furthermore, as oppose to other FIR filter implementations, this architecture uses a single power supply on the chip, creating a savings of one pin per package corresponding to the digital power supply. Thus, a FIR filter structure in accordance with the present invention represents a more reliable, power efficient, modular FIR filter architecture which saves power supply packaging pins and ease of large-scale implementation.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

The present invention employs a master/slave sample and hold architecture to achieve the advantages described earlier. An input signal may be coupled to a master input of a master sample and hold circuit. A plurality of slave sample and hold circuits may then be coupled to the output of the master sample and hold circuit. The master sample and hold circuit is preferably a high speed sample and hold circuit having a precise sampling instant. Because the slave sample and hold circuits sample the output of the master sample and hold circuit during a whole period, the slave sample and hold circuits will sample a DC value. Consequently, the slave sample and hold circuits are not required to acquire a fast moving signal and therefore do not have to be as fast as the master sample and hold circuit. The slave sample and hold circuits, therefore, typically are less complex, consume less layout area in an integrated circuit, and consume less power than the master sample and hold circuit.

Figure 1:
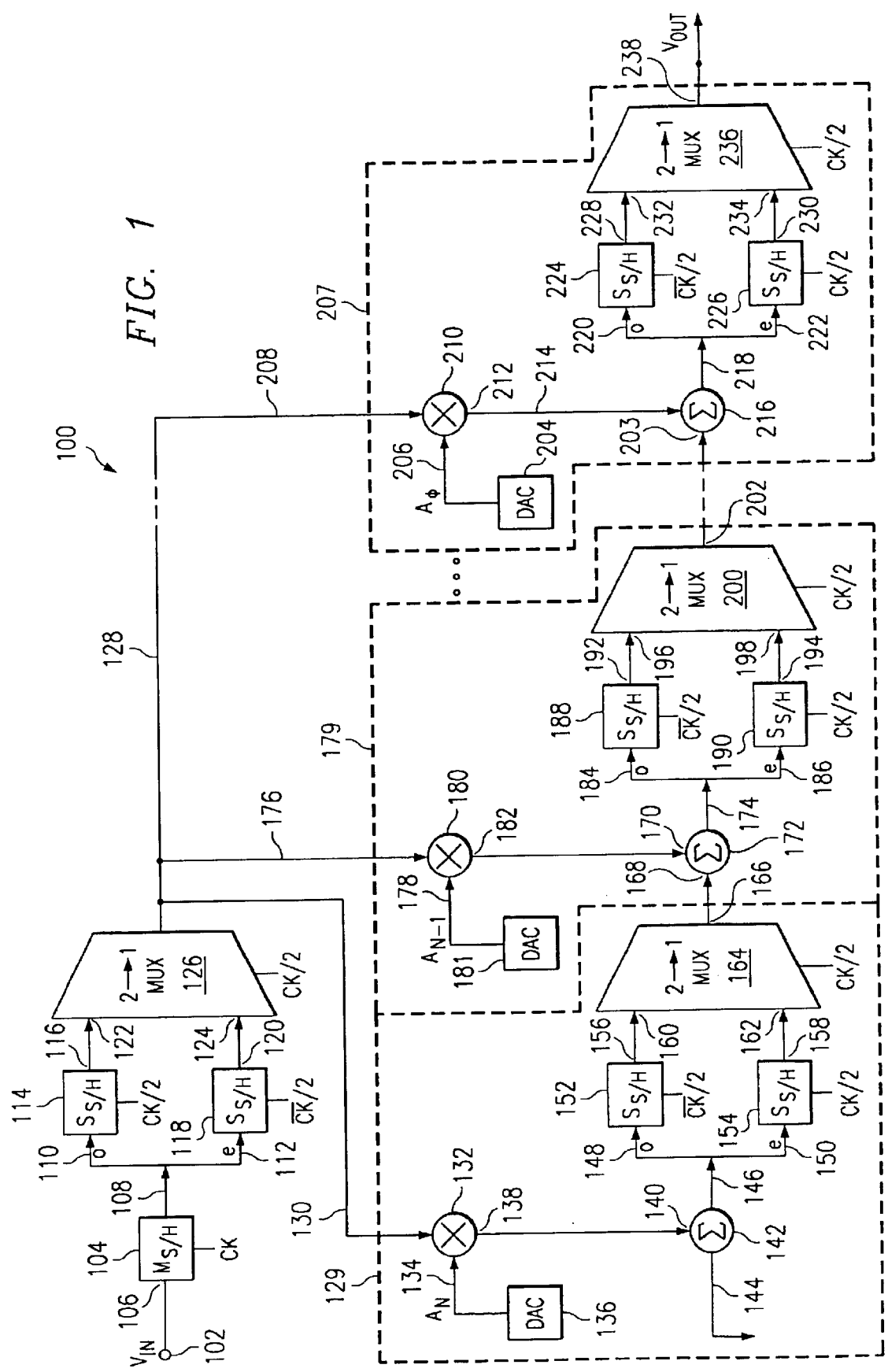
FIG. 1 illustrates one embodiment of a FIR filter constructed in accordance with the teachings of the present invention.

FIG. 1 illustrates a preferred embodiment of a FIR filter 100 constructed in accordance with the teachings of the present invention. FIR filter 100 employs a novel master/slave sample and hold architecture. FIR filter 100 comprises master sample and hold circuit 104, slave sample and hold circuits 114, 118, multiplexer 126 and tap block cells 129, 179, 207. Each tap block cell 129, 179, 207 includes a multiplier, a summer, a pair of slave sample and hold circuits, and a multiplexer. FIR filter 100 is a N tap filter. FIR filter 100, however, could have any number of taps. Similarly, although the number of summers 142, 172, 216 and multipliers 132, 180, 210 equals the number of taps in FIR filter 100, more or less slave sample and hold circuits 114, 118, 152, 154, 188, 190, 224, 226 could be used in a N tap filter in accordance with the present invention.

Master sample and hold circuit input 106 receives an input signal $V_{IN}$. Input signal $V_{IN}$ may be, for example, the input signal received at input 102 and filtered by FIR filter 100. Timing for master sample and hold circuit 104 may be controlled by one or more external clock signals $C_K$. As described above, master sample and hold circuit 104 preferably is a high speed sample and hold circuit with a precise sampling instant. Placing a master sample and hold in front of the odd and even sample and hold circuits improves dynamic performance (i.e. acquisition errors).

The inputs 110, 112 of slave sample and hold circuits 114, 118 each are coupled to the output 108 of master sample and hold circuit 104. Timing for slave sample and hold circuits 114, 118 may be controlled by one or more external clock signals at substantially half the speed of the master clock $C_K$. Since overlapping clocks are required, both true and complement signals are fed into the clocking inputs of slave sample and hold circuits 114, 118. Here, the output 116, 120 of each slave sample and hold circuit 114, 118 is connected to one input of each of multiplexer 126. In this embodiment, slave sample and hold circuits 36–44 have analog inputs and analog outputs. However, sample and hold circuits 36–44 may have any combination of analog or digital inputs and analog or digital outputs.

Alternatively, more than two slave sample and hold circuits may be connected to multiplexer 126. Thus, in the case where the number of slave sample and hold circuits, k, is even, timing for each slave sample and hold circuit may be controlled by one or more external clock signals at approximately 1/k times the speed of the master clock $C_K$. Since overlapping clocks are required, both true and complement signals are fed into the clocking inputs of a first and second slave sample and hold circuit within making up pair of slave sample and hold circuits. Similarly, in the case where the number of slave sample and hold circuits, k, is odd, timing for each slave sample and hold circuit may be controlled by one or more external clock signals at approximately 1/k times the speed of the master clock $C_K$. Such is the case when adding a larger number of slave sample and hold circuits to each tap block cell. Adding a larger number of slave sample and hold circuits, however, may degrade the speed and increase in parasitic capacitance at the output.

Multiplexers 126, 164, 200, 236 include a plurality of inputs and an output. Multiplexers 126, 164, 200, 236 may be controlled by external control signals (not explicitly shown). The output of each multiplexer 126 connects to the inputs of each tap block cell 129, 179, 207. Here, multiplexers 126, 164, 200, 236 have analog inputs and analog outputs, but any combination of analog or digital inputs and analog or digital outputs could be used.

As stipulated above, each tap block cell 129, 179, 207 includes a multiplier, a summer, a pair of slave sample and hold circuits, and a multiplexer. Moreover, each tap block cell 129, 179, 207 includes a first and second input and an output, wherein the first inputs as stipulated above are coupled to the output of multiplexer 126. The second input of each tap block cell 129, 179, 207 is coupled to the previous tap block cell output. Specifically, the second input of tap block cell 179 is coupled to the output of tap block cell 129 and the second input of tap block cell 207 is coupled to the output of a previous tap block cell (not explicitly shown).

In particular, tap block cell 129 includes a multiplier 132 having a first and second input 130 and 134. The first input 130 couples to the input of tap block cell 129. Multiplier 132 may be a multiplying DAC, where Multiplier 132 multiplies analog input 130 with an analog output from DAC 126 which receives one digital input producing an analog product of the two inputs 130, 134. Multiplier 132 can also be, for example, any other type of multiplier with any combination of analog or digital inputs and an analog output. Similarly, within each tap block cell 179, 207, the multipliers 180, 210 may multiply analog inputs 176 and 208 with the output of DACs 181 and 204. The multipliers 180, 210 receive one or multiple digital inputs 178 and 206, respectively; whereby, each multiplier 180 and 210 coverts each digital input into an analog value and produces an analog product of inputs 176, 178, 206, 208. Each multiplier 180, 210 can also be, for example, any other type of multiplier with any combination of analog or digital inputs and an analog output.

One input 134, 178, 206 of multipliers 132, 180, 210 receives a coefficient signal $A_0$–$A_{N-1}$. For example, multiplier 132 receives coefficient $A_{N-1}$ at input 134, an analog coefficient which may be derived from a digital value as indicated through the digital to analog converter circuit 136. Such is the case for all coefficient signals $A_0$–$A_{N-1}$ utilizing DACs 204, 181 and 136, respectively. A digital coefficient signal applied to DAC 136 can have any number of bits. Furthermore, coefficient $A_{N-1}$ applied to DACs 136, 181, 204 can have a different number of bits. Similarly, ones of coefficient signals $A_0$–$A_{N-1}$ can be converted digital signals while others of coefficient signals $A_0$–$A_{N-1}$ can be analog signals.

Coefficient signals $A_0$–$A_{N-1}$ may be supplied by a coefficient register (not shown). This coefficient register may be a programmable register that receives data values for coefficients $A_0$–$A_{N-1}$ from an outside source (not explicitly shown). By using the programmable coefficient register, a programmable multi-tap FIR filter integrated circuit may be created. A FIR coefficient register may produce, for example, m bit digital outputs for coefficient signals $A_0$–$A_{N-1}$.

Another alternative to a coefficient register is a plurality of coefficient circuits (not explicitly shown). Each coefficient circuit can produce a coefficient signal ($A_1$–$A_{N-1}$) at an output to the coefficient circuits, with each coefficient signal representing a FIR coefficient. The outputs of such coefficient circuits can then be coupled to an input of multipliers 132, 180, 210. Such coefficient circuits can be either hardwired or programmable.

Furthermore, each tap block cell 129, 179, 207 includes summers 142, 172, 216, wherein each summer has a first and second input and an output. The first input 144 of summer 142 couples to ground; however, the first inputs 168, 203 of summers 172, 216 couple to outputs from the previous tap cell block. The second inputs 140, 170, 214 of summers 142, 172, 216 couple to outputs 138, 182 and 212, respectively.

Summers 142, 172, 216 may be, for example, an analog summer that receives two analog inputs and produces an analog output. Alternatively, summer 142, 172, 216 could be an analog summer that receives analog inputs and includes a digital-to-analog converter (DAC) to produce a digital output. Similarly, summer 142, 172, 216 could produce a digital output from a plurality of digital inputs or produce an analog output from a plurality of digital inputs.

Slave sample and hold circuits 152, 154, 188, 190, 224, 226 couple to receive outputs 146, 174 and 218 as shown. The outputs of each slave sample and hold circuit pair couple to the inputs of multiplexers 164, 200 and 236. Specifically, outputs 156, 158 couple to multiplexer inputs 160, 162; outputs 192, 194 couple to multiplexer inputs 196, 198; and outputs 228, 230 couple to multiplexer inputs 232, 234.

The output 238 of multiplexer 236, $V_{OUT}$, may represent the output signal produced by FIR filter 100. However, output signal of FIR filter 100 could be observed at output of summer 216. The sample and hold circuits 224 and 226 provide signal stability at the output of FIR filter 100.

Figure 4:
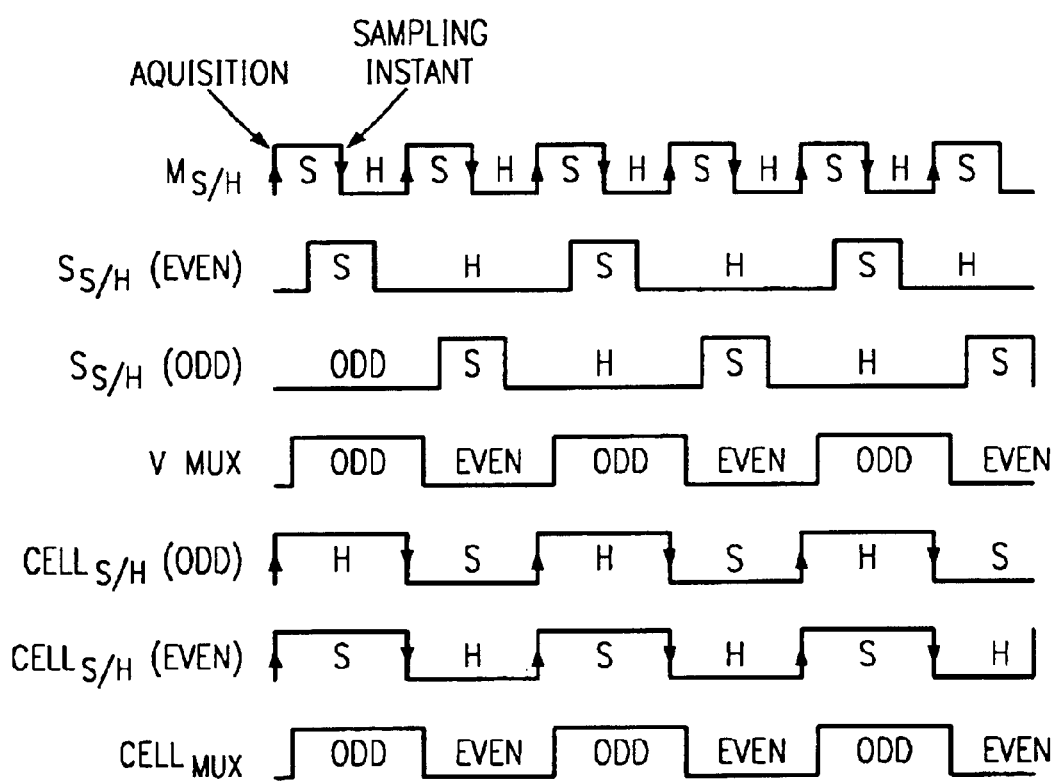
FIG. 4 illustrates timing signal for the clocking signals mapped to the output signals for the FIR filter shown in FIG. 1.

The operation of the embodiment of FIR filter 100 illustrated in FIG. 1 can be described in conjunction with the timing diagram illustrated in FIG. 4. Signal $C_K$ of FIG. 1 is an externally generated clock signal to supply signal $M_{SH}$ in FIG. 4 which represents a clock signal controlling master sample and hold circuit 104, while $S_{SH}$(even) and $S_{SH}$(odd) represent both true and complement signal $C_K/2$ for controlling slave sample and hold circuits 114 and 118. In the first embodiment of FIR filter 100, master sample and hold circuit 104 and slave sample and hold circuits 114, 118 sample during a clock signal high and hold during a clock signal low. Other sampling techniques, however, could also be used in FIR filter 100. During the rising edge of signal $M_{SH}$, data acquisition occurs and, during the falling edge, a sampling instant occurs. Thus, the capturing of the signal occurs at the falling edge of the signal $M_{SH}$. The sample is held in this embodiment for substantially ½ a clock cycle.

As the timing diagram of FIG. 4 illustrates, master sample and hold circuit 104 may sample the input signal $V_{IN}$ during each clock cycle. In this embodiment, master sample and hold circuit 104 samples the input signal for ½ cycle of clock signal $C_K$ and holds the sampled signal for the other ½ clock cycle of clock signal $C_K$. Each slave sample and hold circuit 114 and 118 samples the output of master sample and hold circuit 104 for approximately ½ clock cycle and holds the sampled signal for the remaining ½ clock cycle and an additional clock cycle. Since both the slave sample and hold circuits 114 and 118 operate at substantially $C_K/2$ the sample and hold period of both circuits occurs during 2 clock cycles of signal $M_{SH}$, wherein the odd slave sample and hold circuit samples during the first clock cycle of signal $M_{SH}$ and the even slave sample and hold circuit samples during the second clock cycle of the signal $M_{SH}$. Thus, effectively, signal $S_{SH}$ (odd) and signal $S_{SH}$ (even) samples signal $M_{SH}$ during every odd and even clock cycles of the $M_{SH}$, respectively. Since there is no need for the slave sample and hold circuit to capture the signal right at the edge of the hold period of signal $M_{SH}$, signal $S_{SH}$ (odd) samples the signal MSH slightly delayed after the rising edge (acquisition) of signal $M_{SH}$. The purpose is that the slave sample and hold circuit capture signal $M_{SH}$ during its hold period, since errors would occur if the signal were sampled during acquisition. As illustrated, the sampling period for each slave sample and hold circuits 114 and 118 may begin a short time after the rising edge of the clock signal, $M_{SH}$, controlling master sample and hold circuit 104. The falling edge signal $S_{SH}$ captures held signal at the master sample and hold circuit output 108.

Multiplexer 126 multiplexes each signal $S_{SH}$ (odd) and signal $S_{SH}$ (even). Signal VMUX, in FIG. 4, which represents a clock signal controlling multiplexer 126, enables the multiplexer 126 to multiplex the signals held by slave sample and hold circuits 114 and 118. Accordingly, when signal VMUX is high, the held signal of the odd slave sample and hold circuit 114 is multiplexed at the output of the multiplexer 126 and, when signal VMUX is low, the held signal of even slave sample and hold circuit 118 is multiplexed at the output of the multiplexer 126.

Each tap block cell 129, 179, and 207 receives the multiplexed signal which is multiplied by the corresponding FIR coefficient. The products are summed with the previous tap block cell output and then fed into the slave sample and hold circuits 152, 154, 188, 190, 224, and 226. As shown in the timing diagram in FIG. 4, Cell$_{S/H}$ (odd) and Cell$_{S/H}$ (even) represent the clocking signals applied to odd slave sample and hold circuits 152, 188 and 224 and even sample and hold circuits 154, 190, and 226; while Cell$_{MUX}$ represents the clocking signal applied to multiplexers 164, 200, and 236. In general, when signal Cell$_{MUX}$ is high, the held signal of the odd slave sample and hold circuit 152, 188 and 224 is multiplexed at the output of each respective multiplexer 164, 200, and 236 and, when signal Cell$_{MUX}$ is low, the held signals of even slave sample and hold circuits 154, 190, and 226 is multiplexed at the output of each respective multiplexer 164, 200, and 236.

Assuming the input signal $V_{IN}$ held in each filter tap has a gain error and offset associated with each multiplier, summer, and sample and hold circuit. Accordingly, the gain and offset error for a FIR filter architecture including five taps can be represented by the following equations:

$$V_o = [A'_4 V_i z^{-4} + A'_3 V_i z^{-3} + A'_2 V_i z^{-2} + A'_1 V_i z^{-1} + A'_0 V_i] + [E_4 z^{-4} + E_3 z^{-3} + E_2 z^{-2} + E_1 z^{-1} + E_0]$$

$$\text{Error}(E_i) = E_4 z^{-4} + E_3 z^{-3} + E_2 z^{-2} + E_1 z^{-1} + E_0$$

where $V_0$ is the output signal sequence, $\Gamma_i$ represents gain error, $V_i$ is the ideal input signal sequence, $E_i$ represents offset error, Ai represents each coefficient and $A'_i = A_i \Gamma_i$.

If offset error, $E_i$, is not signal dependent and is constant for a given current bias and clock rate, then this error is nothing more than an accumulated offset which can be compensated for at the output. Offset errors due to delay line accumulation may not be a problem for a small number of taps (i.e. between five and seven taps). Gain errors due to each stage "cell" in the FIR, however, can be corrected using the tap coefficients. Offset errors in each stage are multiplied by tap coefficients and accumulated. As long as the offsets are not signal dependent, which is guaranteed in the sample and hold design, the net result is offset at output of filter.

The advantages of this FIR filter architecture include but are not limited to a simple, modular layout whereby the design is cost effective. Since it is self contained, this architecture does not require expensive digital logic circuitry. In addition, there is no need for a round robin clock nor additional logic to supply power. As oppose to other FIR filter implementations, this architecture requires one power supply on the chip, creating a savings of one pin per package corresponding to the digital power supply. Moreover, a FIR filter in accordance with the present invention enables the expansion of the number of taps without speed degradation.

Furthermore, placing odd and even sample and hold circuits at the input and in each cell reduces the circuit speed requirement such that the FIR filter shown in FIG. 1 requires half the speed of the conventional FIR filter. The constant signal propagating from the sample and hold circuit to the multiplexer promotes linearity in the design.

Another advantage can be found in the architectures application in a Hard Disk Drive (HDD) read channel.

Conventionally, FIR bypass circuitry is required in a HDD read channel prior to the settling of the filtered signal. The FIR filter in accordance to the present invention provides a FIR bypass without adding additional components to the circuit design.

Figure 2:
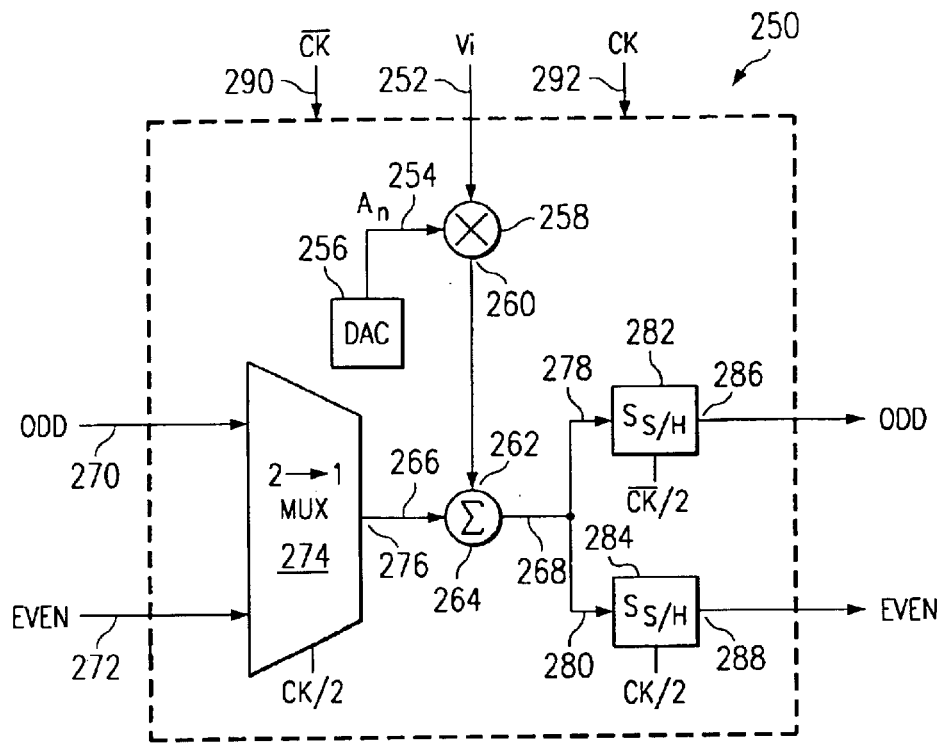
FIG. 2 illustrates one cell embodiment for the FIR filter shown in FIG. 1.

FIG. 2 illustrates a modular tap block cell design in accordance with the present invention. As shown, cell 250 includes multiplexer 274, multiplier 258, summer 264 and slave sample and hold circuits 282 and 288. Odd and even signal inputs are coupled to cell 250 at inputs 270 and 272 which couple to the inputs of multiplexer 274. Input signal $V_i$ couples into multiplier 258 at input node 252 along with FIR coefficient tap $A_{N-1}$ at input node 254. The product 260 is summed with the multiplexed output 276. The sum 268 is fed into the inputs of slave sample and hold circuits 282 and 284. The operation of cell 250 follows that which is described for FIG. 1 when cell 250 is coupled in the given arrangement as shown in FIG. 1.

Figure 3:
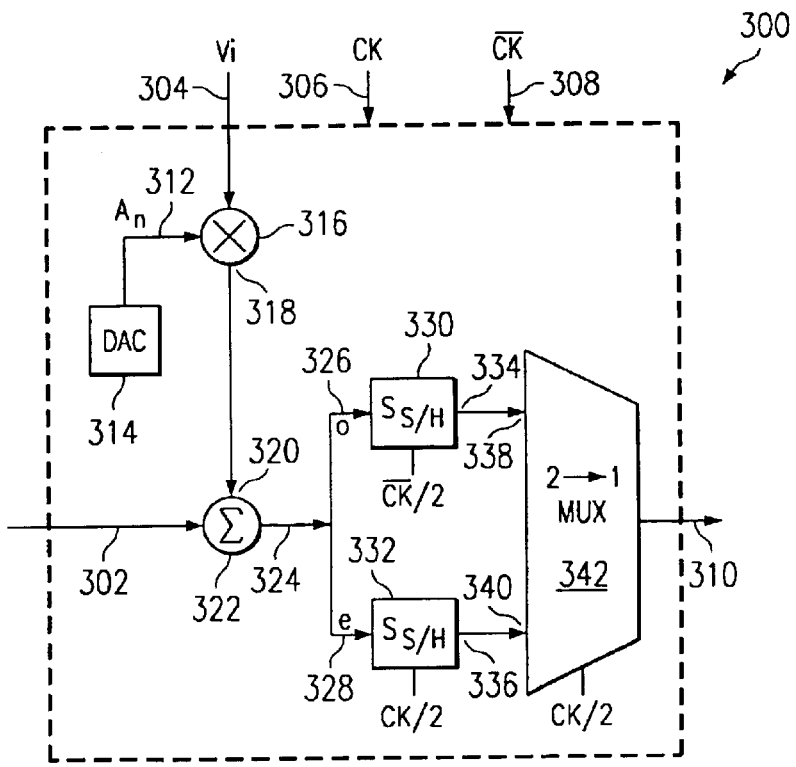
FIG. 3 illustrates another cell embodiment for the FIR filter shown in FIG. 1.

FIG. 3 illustrates another modular tap block cell design that may be used to implement the FIR filter architecture in accordance with the present invention. As shown cell 300 includes summer 322, multiplier 316, slave sample and hold circuits 330 and 332, and multiplexer 342. Input signal $V_i$ couples into multiplier 316 at input node 304 along with FIR coefficient tap $A_{N-1}$ at input node 312. The product at node 318 is summed with the signal received at input 302. The sum at node 324 is fed into the inputs of slave sample and hold circuits 330 and 332. The outputs of the slave circuits 330 and 332 are multiplexed by multiplexer 342. Multiplexed output 310 represents the output for this cell implementation. The operation of cell 250 follows that which is described for FIG. 1 when cell 250 is coupled in the given arrangement as shown in FIG. 1.

It is also envisioned that the presented embodiments in FIGS. 1–3 may be transformed into digital implementations wherein all sample and hold circuits are substituted with digital registers.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A finite impulse response filter cell, having at least three inputs and at least two outputs, the finite impulse response filter cell coupled to receive a clocking signal, comprising:
    a multiplexer having at least two multiplexer inputs and an output, the multiplexer operable at substantially half the clocking signal rate, each of the at least two multiplexer inputs coupled to one of the at least three inputs of the finite impulse response filter cell;
    a multiplier including an output and at least two multiplier inputs, the first multiplier input receiving a coefficient signal representing a FIR coefficient, the second multiplier input coupled to one of the at least three inputs of the finite impulse response filter cell;
    a summer having at least two summer inputs and an output, the first and second summer inputs coupled to receive the multiplexer output and the multiplier output;
    at least two slave sample and hold circuits each having a slave input and a slave output, the at least two slave inputs of the plurality coupled to the summer output, the at least two slave outputs couple to form the at least two outputs of the finite impulse response filter cell, each slave sample and hold circuit operable at substantially half the clocking signal rate; and
    a conversion circuitry coupled to the second multiplier input, the conversion circuitry operable to convert a digital value at the second multiplier input into an analog signal.

2. The finite impulse response filter of claim 1, wherein each coefficient signal comprises a digital value.

3. A finite impulse response filter cell, having at least two inputs and an output, the finite impulse response filter cell coupled to receive a clocking signal, comprising:
    a multiplier including an output and at least two multiplier inputs, the first multiplier input receiving a coefficient signal representing a FIR coefficient, the second multiplier input coupled to one of the at least two inputs of the finite impulse response filter cell;
    a summer having at least two summer inputs and an output, the first summer input coupled to receive the multiplier output, the second summer input coupled to one of the at least two inputs of the finite impulse response filter cell;
    at least two slave sample and hold circuits each having a slave input and a slave output, the at least two slave inputs coupled to the summer output, each slave sample and hold circuit operable at half the clocking signal rate;
    a multiplexer having at least two multiplexer inputs and an output, each of the at least two slave outputs coupled to one of the at least two multiplexer inputs, the multiplexer operable at half the clocking signal rate, the multiplexer output couples to form the output of the finite impulse response filter cell; and
    a conversion circuitry coupled to the second multiplier input, the conversion circuitry operable to convert a digital value at the second multiplier input into an analog signal.

4. The finite impulse response filter of claim 3, wherein each coefficient signal comprises a digital value.

5. A finite impulse response filter having an input and an output, comprising:
    a master sample and hold circuit including a master input and a master output, the master input coupled to form the input of the finite impulse response filter, the master sample and hold circuit operable to sample a first input signal and hold the value of the first input signal on the master output for a first predetermined period of time, the master sample and hold circuit operable at a clock speed;
    at least two slave sample and hold circuits, each of the at least two slave sample and hold circuits comprising a slave input and a slave output, each the at least two slave inputs coupled to the master output, each of the at least two sample and hold circuits operable to sample the master output signal and hold the value of the signal on the plurality of slave outputs for a second predetermined period of time, the at least two slave sample and hold circuits operable at substantially 1/k times the clock speed of the master sample and hold circuit, where k equals the number of slave sample and hold circuits;

a first multiplexer, having at least two first multiplexer inputs and a first multiplexer output, each of the at least two first multiplexer inputs coupled to one of the at least two slave outputs, the first multiplexer operable at substantially 1/k times the clock speed of the master sample and hold circuit; and at least one tap block having a tap block input and a tap block output, the tap block input coupled to the first multiplexer output, the at least one tap block, comprising, a multiplier having a first and a second multiplier input and an multiplier output, the first multiplier input coupled to the tap block input, the second multiplier input coupled to receive a coefficient signal representing a FIR coefficient, a summer including an output and a first and a second summer input, the first input coupled to the multiplier output, at least two slave sample and hold circuits, each of the at least two slave sample and hold circuits comprising a slave input and a slave output, each the at least two slave inputs coupled to the summer output, the at least two slave sample and hold circuits operable at substantially 1/k times the clock speed of the master sample and hold circuit, where k equals the number of slave sample and hold circuits, a second multiplexer, having at least two second multiplexer inputs and a second multiplexer output, each of the at least two second multiplexer inputs coupled to one of the at least two slave outputs of the tap block, the second multiplexer operable at substantially 1/k times the clock speed of the master sample and hold circuit, the second multiplexer output coupled to form the tap block output, the tap block output couples to form a filter output.

6. The finite impulse response filter of claim 5, wherein each coefficient signal comprises a digital value.

7. The finite impulse response filter of claim 5, further comprises a conversion circuitry coupled to the second multiplier input, the conversion circuitry operable to convert a digital value at the second multiplier input into an analog signal.

8. An finite impulse response filter having an output, comprising:

a master sample and hold circuit including a master input and a master output, the master input coupled to the input of the finite impulse response filter, the master sample and hold circuit operable to sample a first input signal and hold the value of the first input signal on the master output for a first predetermined period of time, the master sample and hold circuit operable at a clock speed;

a plurality of slave sample and hold circuits, each of the plurality of slave sample and hold circuits comprising a slave input and a slave output, each of the plurality of sample and hold circuits operable to sample a signal and hold the value of the signal on the plurality of slave outputs for a second predetermined period of time, the plurality of slave sample and hold circuits operable at substantially half the clock speed of the master sample and hold circuit;

a first pair of the plurality of slave sample and hold circuits having each slave input directly connected to the master output;

a plurality of multiplexers, each comprising at least a first and second multiplexer input and an multiplexer output, the first multiplexer operable at substantially half times the clock speed of the master sample and hold circuit, each first and second multiplexer inputs coupled to one pair of slave outputs;

a plurality of multipliers, each of the plurality of multipliers including an output and a first and a second multiplier input, each first multiplier input receiving a coefficient signal representing a FIR coefficient, each second multiplier input coupled to the output of the first multiplexer of the plurality of multiplexers; and a plurality of summers, each of the summers including an output and a first and a second summer input, each first summer input coupled to one of the plurality of multiplier outputs, the second summer input of the first summer couples to ground, each remaining second summer inputs coupled to one of the plurality of multiplexer outputs, each pair of slave inputs succeeding the first pair of slave inputs connected to one of the plurality of summer outputs;

the number of plurality of slave sample and hold circuits equals 2N, the number of plurality of multiplexers equals N, the number of plurality of summers equals N, the number of plurality of multipliers N+2;

the multiplexer output of the last one of the plurality of multiplexers couples to form the output of the finite impulse response filter.

9. The finite impulse response filter of claim 8, wherein each coefficient signal comprises a digital value.

10. The finite impulse response filter of claim 8, further comprises a conversion circuitry coupled to the second multiplier input, the conversion circuitry operable to convert a digital value at the second multiplier input into an analog signal.

11. A method of making an finite impulse response filter which has an output, comprising the steps of:

coupling an input signal to a master input of a master sample and hold circuit;

directly connecting a master output of the master sample and hold circuit to a plurality of slave sample and hold circuits;

multiplexing the plurality of slave sample and hold circuit output signals;

directly connecting the multiplexed output to at least one tap block cell having a first and second input and an output, including a multiplier, a summer, a plurality of slave sample and hold circuits and a multiplexer;

supplying a fixed tap coefficient signal to an input of the multiplier;

multiplying the first input of the tap block cell and the fixed tap coefficient signal;

summing an output of the multiplier with the second input of the tap block cell;

connecting an output of the summer to the inputs of the plurality of slave sample and hold inputs of the tap block cell;

connecting the slave outputs of the plurality of slave sample and hold circuits to the plurality of multiplexer inputs of the multiplexer in the tap block; and multiplexing the slave output signals to generate the finite impulse response filter output.

12. The method of claim 11, wherein the first input of the first tap block cell is grounded.

* * * * *